US010367025B2

(12) United States Patent
Sato et al.

(10) Patent No.: US 10,367,025 B2
(45) Date of Patent: *Jul. 30, 2019

(54) SOLID-STATE IMAGING DEVICE AND METHOD OF MANUFACTURING THE DEVICE

(71) Applicant: PANASONIC INTELLECTUAL PROPERTY MANAGEMENT CO., LTD., Osaka (JP)

(72) Inventors: Yoshihiro Sato, Osaka (JP); Ryohei Miyagawa, Kyoto (JP); Tokuhiko Tamaki, Osaka (JP); Junji Hirase, Osaka (JP); Yoshiyuki Ohmori, Osaka (JP); Yoshiyuki Matsunaga, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/850,645

(22) Filed: Dec. 21, 2017

(65) Prior Publication Data

US 2018/0114811 A1    Apr. 26, 2018

Related U.S. Application Data

(63) Continuation of application No. 14/556,093, filed on Nov. 28, 2015, now Pat. No. 9,881,960, which is a (Continued)

(30) Foreign Application Priority Data

Jun. 26, 2012 (JP) ................................. 2012-143129

(51) Int. Cl.
   *H01L 27/146* (2006.01)
   *H04N 5/363* (2011.01)
   (Continued)

(52) U.S. Cl.
   CPC ...... *H01L 27/14643* (2013.01); *H01L 21/266* (2013.01); *H01L 21/823456* (2013.01);
   (Continued)

(58) Field of Classification Search
   CPC ......... H01L 27/14643; H01L 27/14665; H01L 27/14609; H01L 21/266; H01L 21/823481;
   (Continued)

(56) References Cited

U.S. PATENT DOCUMENTS 9,881,960 B2 *   1/2018   Sato ...................... H04N 5/363
2004/0000681 A1   1/2004   Shinohara et al.
(Continued)

FOREIGN PATENT DOCUMENTS

JP   2007-180557 A   7/2007
JP   2008-205022 A   9/2008
(Continued)

OTHER PUBLICATIONS

International Search Report issued in International Application No. PCT/JP2013/002958 dated Jul. 2, 2013, with English Translation.
(Continued)

*Primary Examiner* — Bitew A Dinke
(74) *Attorney, Agent, or Firm* — McDermott Will & Emery LLP

(57) ABSTRACT

Each unit pixel includes a photoelectric converter, an n-type impurity region forming an accumulation diode together with the semiconductor region, the accumulation diode accumulating a signal charge generated by the photoelectric converter, an amplifier transistor including a gate electrode electrically connected to the impurity region, and an isolation region formed around the amplifier transistor and implanted with p-type impurities. The amplifier transistor includes an n-type source/drain region formed between the
(Continued)

gate electrode and the isolation region, and a channel region formed under the gate electrode. A gap in the isolation region is, in a gate width direction, wider at a portion including the channel region than at a portion including the source/drain region.

20 Claims, 8 Drawing Sheets

Related U.S. Application Data continuation of application No. PCT/JP2013/002958, filed on May 8, 2013.

(51) Int. Cl.
*H04N 5/378* (2011.01)
*H01L 21/266* (2006.01)
*H01L 21/8234* (2006.01)

(52) U.S. Cl.
CPC .. *H01L 21/823481* (2013.01); *H01L 27/1461* (2013.01); *H01L 27/1463* (2013.01); *H01L 27/14609* (2013.01); *H01L 27/14612* (2013.01); *H01L 27/14665* (2013.01); *H01L 27/14689* (2013.01); *H04N 5/363* (2013.01); *H04N 5/378* (2013.01)

(58) Field of Classification Search
CPC ....... H01L 21/823456; H01L 27/14612; H01L 27/1463; H01L 27/14689; H01L 27/1461; H04N 5/363; H04N 5/378
See application file for complete search history.

(56) References Cited

U.S. PATENT DOCUMENTS

| | | | |
|---|---|---|---|
| 2006/0082668 A1* | 4/2006 | Inoue | H01L 27/14603 348/308 |
| 2006/0131624 A1* | 6/2006 | Katsuno | H01L 27/14689 257/292 |
| 2006/0226438 A1 | 10/2006 | Katsuno et al. | |
| 2007/0128954 A1* | 6/2007 | Itonaga | H01L 27/1463 439/852 |
| 2007/0145446 A1 | 6/2007 | Lee | |
| 2008/0067589 A1* | 3/2008 | Ito | H01L 29/66575 257/344 |
| 2008/0197387 A1 | 8/2008 | Itonaga et al. | |
| 2008/0296645 A1* | 12/2008 | Itonaga | H01L 27/14609 257/294 |
| 2010/0025569 A1 | 2/2010 | Matsumoto et al. | |
| 2011/0049665 A1 | 3/2011 | Goto | |
| 2011/0073923 A1* | 3/2011 | Tatani | H01L 27/14603 257/291 |
| 2011/0127408 A1* | 6/2011 | Yanagita | H01L 27/14603 250/208.1 |
| 2011/0127592 A1* | 6/2011 | Yanagita | H01L 27/14603 257/291 |
| 2012/0049254 A1 | 3/2012 | Itonaga | |
| 2012/0119272 A1 | 5/2012 | Inui | |
| 2013/0049083 A1 | 2/2013 | Itonaga et al. | |
| 2013/0056808 A1 | 3/2013 | Tai et al. | |
| 2013/0107095 A1 | 5/2013 | Yarino et al. | |
| 2013/0113060 A1* | 5/2013 | Matsunaga | H01L 27/14632 257/431 |
| 2013/0292750 A1 | 11/2013 | Chen et al. | |
| 2013/0323876 A1 | 12/2013 | Lu et al. | |
| 2014/0264476 A1* | 9/2014 | Tseng | H01L 29/808 257/256 |
| 2015/0090998 A1 | 4/2015 | Hirase et al. | |
| 2015/0109503 A1 | 4/2015 | Mori et al. | |
| 2015/0115338 A1 | 4/2015 | Taruki et al. | |
| 2015/0123180 A1 | 5/2015 | Sato et al. | |

FOREIGN PATENT DOCUMENTS

| | | | | |
|---|---|---|---|---|
| JP | 2009-016810 | A | | 1/2009 |
| JP | 4420039 | B2 | | 2/2010 |
| JP | 4444371 | B1 | | 3/2010 |
| JP | 2011-114036 | A | | 6/2011 |
| JP | 2011-114323 | A | | 6/2011 |
| JP | 2011114036 | A | * | 6/2011 |
| JP | 2011114036 | A | * | 6/2011 |
| JP | 2011-243704 | A | | 12/2011 |
| JP | 2012-060076 | A | | 3/2012 |
| JP | 2012-64822 | A | | 3/2012 |
| JP | 2012-064822 | A | | 3/2012 |
| JP | 6179865 | B2 | | 8/2017 |
| WO | 2012/005011 | A1 | | 1/2012 |
| WO | 2012/005014 | A1 | | 1/2012 |
| WO | WO-2012005014 | A1 | * | 1/2012 ....... H01L 27/14632 |

OTHER PUBLICATIONS

Non-Final Office Action issued in U.S. Appl. No. 14/556,093, dated Nov. 30, 2015.
Final Office Action issued in U.S. Appl. No. 14/556,093, dated Jul. 11, 2016.
Non-Final Office Action issued in U.S. Appl. No. 14/556,093, dated Jan. 10, 2017.
Final Office Action issued in U.S. Appl. No. 14/556,093, dated Apr. 4, 2017.
Notice of Allowance issued in U.S. Appl. No. 14/556,093, dated Oct. 10, 2017.

* cited by examiner

SOLID-STATE IMAGING DEVICE AND METHOD OF MANUFACTURING THE DEVICE

CROSS-REFERENCE TO RELATED APPLICATIONS

This is a Continuation application of U.S. patent application Ser. No. 14/556,093, filed on Nov. 28, 2014, which is a continuation of International Application No. PCT/JP2013/002958 filed on May 8, 2013, which claims priority to Japanese Patent Application No. 2012-143129 filed on Jun. 26, 2012. The entire disclosures of these applications are incorporated by reference herein.

BACKGROUND

The present disclosure relates to solid-state imaging devices and methods of manufacturing the devices.

SUMMARY

In recent years, metal oxide semiconductor (MOS) solid-state imaging devices have been mounted in portable devices with cameras, in-vehicle cameras, monitoring cameras, etc. These solid-state imaging devices have been required to have high-resolution imaging capabilities. There is a need to miniaturize solid-state imaging devices and increase pixels. Conventional solid-state imaging devices miniaturize pixels, thereby reducing the sizes of photo diodes. Accordingly, the amount of saturated signals and the aperture ratio decrease, thereby reducing the sensitivity of the pixels.

On the other hand, isolation regions are formed in solid-state imaging devices by local oxidation of silicon (LOCOS) isolation or shallow trench isolation (STI) what is called "insulating isolation." In the STI, a trench is formed in the upper portion of a semiconductor substrate and a silicon oxide film is buried in the formed trench to form an isolation region. In forming this trench, an etching damage causes defects and interface states or stress, which lead to leakage currents. The charge of a leakage current is indistinguishable from the signal charge photoelectrically converted by a photo diode, and therefore degrades, as noise, the performance of an image sensor. Specifically, since the noise caused by the defects, etc., in the STI increases, the signal-to-noise ratio (hereinafter referred to as an S/N ratio) decreases, resulting in degradation in the sensitivity. In particular, as described above, the degradation in the sensitivity caused by leakage currents is a huge problem in the current progress in miniaturization of pixels.

Forming an isolation region using an impurity semiconductor layer (see, e.g., Japanese Patent No. 4420039 (FIG. 13)) is known as a means of reducing leakage currents. In the solid-state imaging device shown in Japanese Patent No. 4420039, the portion of an isolation region, which is in contact with an n-type semiconductor region functioning as a floating diffusion (FD), is formed by STI. The other portion of the isolation region, which is not in contact with the FD, is a p-type diffusion isolation region. In this configuration, the portion of the isolation region, which is in contact with the n-type semiconductor region functioning as the FD is formed by the STI, thereby reducing the capacitance generated between the n-type semiconductor region of the FD and a semiconductor substrate. Then, the total capacity $C_{FD}$ of the FD decreases, thereby improving the conversion efficiency in converting the charge obtained by the photoelectrical conversion to a signal voltage. As a result, the sensitivity of an image sensor improves. On the other hand, the other portion of the isolation region, which is not in contact with the FD is the p-type diffusion isolation region, thereby reducing leakage currents.

A multilayer solid-state imaging device is suggested as a solid-state imaging device addressing a decrease in the sensitivity caused by reduction in the sizes of photo diodes. The multilayer solid-state imaging device is formed by stacking a photoelectric conversion film on a semiconductor substrate, that is, on the uppermost surface. Light is incident on the top of the multilayer film, and a photoelectric conversion film photoelectrically converts the light to generate a charge. This charge is accumulated in a charge accumulation region (i.e., FD) and read by a charge coupled device (CCD) circuit or a complementary MOS (CMOS) circuit in the semiconductor substrate (see, e.g., Japanese Patent No. 4444371).

Thus, in the multilayer solid-state imaging device, a pn junction functioning as an FD accumulating the signal charge is formed in the semiconductor substrate. The pn junction is electrically connected to a contact, which transmits the signal charge photoelectrically converted by the photoelectric conversion film. In this multilayer solid-state imaging device, a high leakage current at the pn junction of the semiconductor substrate is problematic. As compared to conventional MOS sensors, since the multilayer solid-state imaging device requires a long time to accumulate the signal charge in the FD, the sensitivity is significantly degraded due to the leakage current.

First, the solid-state imaging device shown in Japanese Patent No. 4420039 has the problem of increasing the gate capacity. The increase in the gate capacity reduces the gains in amplifier transistors to degrade the sensitivity. The excessive gate capacity becomes parasitic capacitance of the FD, which is electrically connected to gate electrodes. Since the parasitic capacitance increases the total capacity $C_{FD}$ of the FD, the conversion efficiency decreases in converting the charge obtained by the photoelectrical conversion to the signal voltage.

In the solid-state imaging device shown in Japanese Patent No. 4420039, not the diffusion isolation region but the STI region is in contact with the FD to reduce the total capacity $C_{FD}$. As described above, the STI is insufficient to solve the problem of leakage currents. In particular, this structure causes a serious problem in a multilayer solid-state imaging device, which requires a decrease in leakage currents in an FD.

In the structure in which the isolation region is made of an impurity diffusion layer, the impurity ions are diffused from the isolation region to the channel region to reduce the effective channel width. This varies the transistor characteristics and degrades the performance, and thus miniaturization becomes difficult.

There is a need to form the isolation region before gates to obtain the solid-state imaging device shown in Japanese Patent No. 4420039. However, as the miniaturization of the pixels proceeds, the isolation region needs to be aligned with the channel regions with high accuracy. Furthermore, in forming the gates, the gates need to be aligned with the channel regions and the isolation region with high accuracy.

After various studies, the present inventors found that diffusion isolation in an isolation region increases an alignment budget, and then miniaturization of pixels becomes difficult.

To address the problems, it is an objective of the present disclosure to improve sensitivity by alleviating a reduction in a signal-to-noise ratio caused by a leakage current, and by reducing an increase in gate capacity.

It is another objective of the present disclosure to reduce differences in transistor characteristics and degradation in performance caused by a decrease in an effective channel width by reducing impurity ions diffused from a diffusion isolation region to a channel region.

It is still another objective of the present disclosure to facilitate miniaturization of pixels by reducing an alignment budget.

The present disclosure may not necessarily achieve all of these objectives but may achieve at least one.

In order to achieve the objectives, the present disclosure provides a solid-state imaging device, in which a gap in a diffusion isolation is, in a gate width direction, wider at a portion including a channel region than at a portion including a source/drain region.

Specifically, a solid-state imaging device according to an aspect of the present disclosure includes a semiconductor region of a first conductivity type; and a plurality of unit pixels arranged in the semiconductor region. Each of the unit pixels includes a photoelectric converter, an impurity region of a second conductivity type forming an accumulation diode together with the semiconductor region, the accumulation diode accumulating a signal charge generated by the photoelectric converter, an amplifier transistor formed in the semiconductor region, and including a gate electrode electrically connected to the impurity region, and a first isolation region formed in the semiconductor region around the amplifier transistor by implanting impurities of the first conductivity type. The amplifier transistor includes a source region or a drain region of the second conductivity type formed in the semiconductor region between the gate electrode and the first isolation region, and a channel region formed in the semiconductor region under the gate electrode. A gap in the first isolation region is, in a width direction of the gate electrode, wider at a portion including the channel region than at a portion including the source region or the drain region.

A method of manufacturing a solid-state imaging device according to an aspect of the present disclosure includes selectively forming a gate electrode on a semiconductor region of a first conductivity type, forming a pattern having a smaller width than the gate electrode by lithography on part of the semiconductor region including the gate electrode, forming an isolation region by implanting impurities of the first conductivity type into the semiconductor region using the gate electrode and the pattern as a mask, and after removing the pattern, forming a source/drain region by selectively implanting impurities of a second conductivity type in the part of the semiconductor region, in which the pattern has been formed.

BRIEF DESCRIPTION OF THE DRAWINGS

FIG. 5A is a cross-sectional view taken along the line Va-Va of FIG. 4. FIG. 5B is a cross-sectional view taken along the line Vb-Vb of FIG. 4.

DETAILED DESCRIPTION

Figure 1:
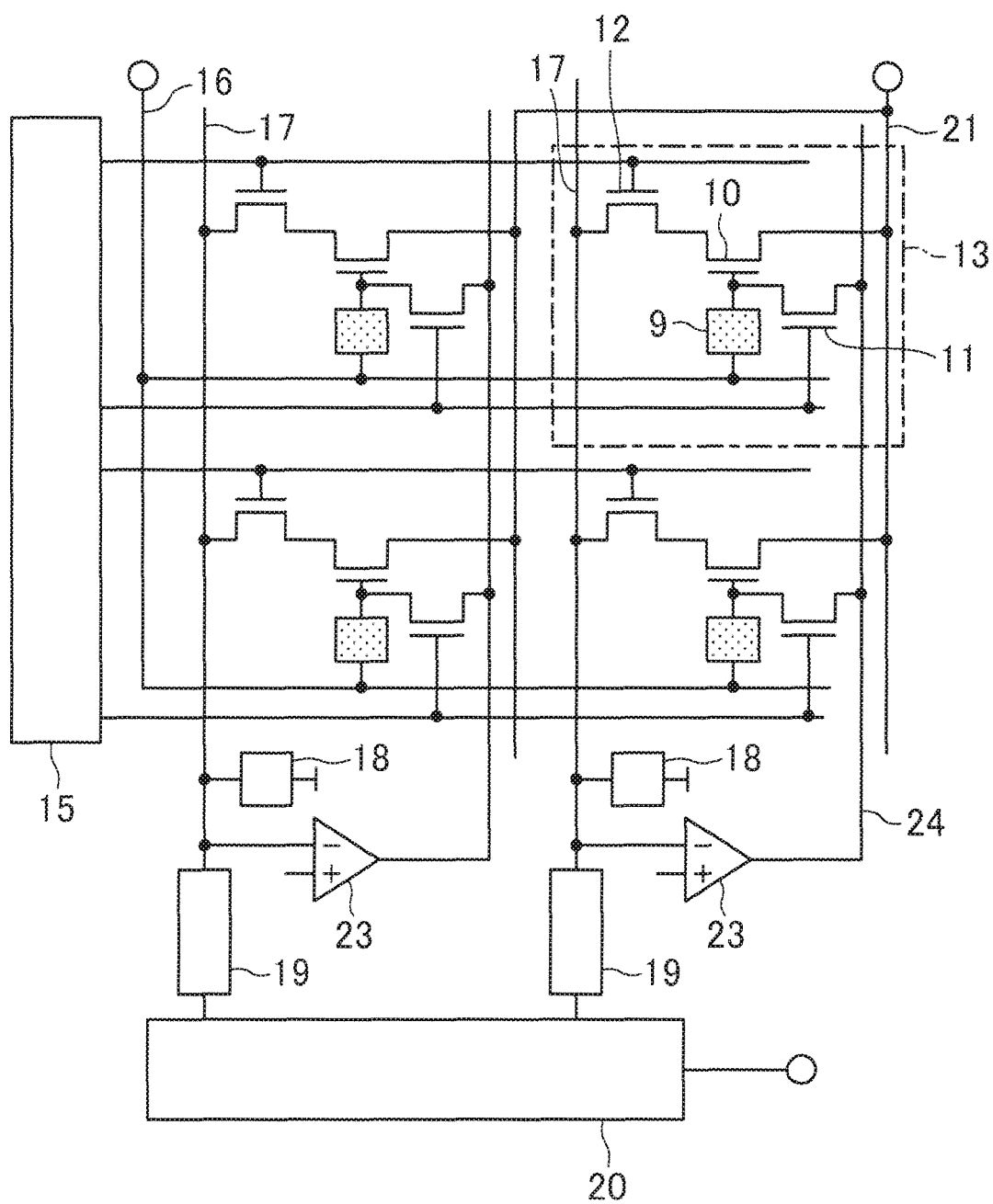
FIG. 1 is a circuit diagram illustrating a solid-state imaging device according to a first embodiment.

A solid-state imaging device according to an embodiment includes a semiconductor region of a first conductivity type; and a plurality of unit pixels arranged in the semiconductor region. Each of the unit pixels includes a photoelectric converter, an impurity region of a second conductivity type forming an accumulation diode together with the semiconductor region, the accumulation diode accumulating a signal charge generated by the photoelectric converter, an amplifier transistor formed in the semiconductor region, and including a gate electrode electrically connected to the impurity region, and a first isolation region formed in the semiconductor region around the amplifier transistor by implanting impurities of the first conductivity type. The amplifier transistor includes a source region or a drain region of the second conductivity type formed in the semiconductor region between the gate electrode and the first isolation region, and a channel region formed in the semiconductor region under the gate electrode. A gap in the first isolation region is, in a width direction of the gate electrode, wider at a portion including the channel region than at a portion including the source region or the drain region.

In the solid-state imaging device according to the embodiment, the first isolation region is formed by implanting the impurities. The gap in the first isolation region is, in the width direction of the gate electrode, wider at the portion including the channel region than at the portion including the source region or the drain region. This reduces protrusion of the gate electrode (gate protrusion) to the channel region in the amplifier transistor, thereby reducing deterioration in the signal-to-noise ratio caused by leakage currents and an increase in the gate capacity. As a result, the sensitivity of the solid-state imaging device improves. In addition, since the gate protrusion decreases, a decrease in the effective channel width due to the impurity ions diffused from the first isolation region is reduced, thereby reducing differences in the transistor characteristics and degradation in the performance.

In the solid-state imaging device according to the embodiment, the first isolation region may be formed around the impurity region.

This structure reduces leakages in the impurity region serving as the accumulation diode region (i.e., the FD) and further improves the sensitivity. The impurity region being the FD is insulated by the first isolation region made of an impurity semiconductor layer, thereby reducing the gate capacitance, which becomes the parasitic capacitance of the FD. As a result, leakages and the total capacity $C_{FDi}$ in the FD decrease at the same time. In particular, significant advantages are provided in a multilayer solid-state imaging device in which leakage currents in an FD are a serious problem.

In the solid-state imaging device according to the embodiment, the photoelectric converter may include a photoelectric conversion film formed above the semiconductor region and configured to photoelectrically convert incident light, a transparent electrode formed above the photoelectric conversion film, and a pixel electrode formed between the semiconductor region and the photoelectric conversion film. The pixel electrode may be electrically connected to the impurity region.

In this multilayer solid-state imaging device, the present disclosure provides significant advantages.

In the solid-state imaging device according to the embodiment, an end surface of the gate electrode in a width direction may form a same plane as an end surface of the first isolation region under the gate electrode.

This structure minimizes gate protrusion. This also reduces a decrease in the effective channel width, thereby improving the sensitivity of the solid-state imaging device and reducing differences in the transistor characteristics and degradation in the performance.

The solid-state imaging device according to the embodiment may further include a second isolation region formed by implanting impurities of the first conductivity type into the semiconductor region and electrically isolating adjacent pairs of the unit pixels. The first isolation region may have a higher impurity concentration than the semiconductor region.

This structure reliably electrically isolates the elements in the upper portion of the semiconductor region from each other. The adjacent unit pixels can be reliably electrically isolated from each other.

In this case, the first isolation region may have a same impurity concentration as the second isolation region.

This enables electrical isolation in each unit pixel and among the unit pixels at the same time, thereby facilitating the manufacturing method.

In the solid-state imaging device according to the embodiment, each of the unit pixels may further include a reset transistor configured to reset a potential of the gate electrode of the amplifier transistor. The channel region of the amplifier transistor may contain impurities of the first conductivity type. A channel region of the reset transistor may contain impurities of the first conductivity type.

This increases the threshold voltage (Vth) of the reset transistor to reduce off-leakages, thereby reducing leakages in the FD, that is, FD leakages.

In the solid-state imaging device according to the embodiment, each of the unit pixels may further include a reset transistor configured to reset a potential of the gate electrode of the amplifier transistor. The channel region of the amplifier transistor contains impurities of the second conductivity type. On the other hand, a channel region of the reset transistor may contain impurities of the first conductivity type.

This increases the threshold voltage of the reset transistor to reduce off-leakages, thereby reducing the FD leakages. On the other hand, the threshold voltage of the amplifier transistor is lowered to reliably drive the amplifier transistor in a saturated region.

A method of manufacturing a solid-state imaging device according to an embodiment includes selectively forming a gate electrode on a semiconductor region of a first conductivity type, forming a pattern having a smaller width than the gate electrode by lithography on part of the semiconductor region including the gate electrode, forming an isolation region by implanting impurities of the first conductivity type into the semiconductor region using the gate electrode and the pattern as a mask, and after removing the pattern, forming a source/drain region by selectively implanting impurities of a second conductivity type in the part of the semiconductor region, in which the pattern has been formed and removed.

In the method of manufacturing the solid-state imaging device according to the embodiment, the isolation region is formed after the gate electrode, thereby reducing alignment budgets. As a result, pixels are more easily miniaturized.

The method of manufacturing the solid-state imaging device according to the embodiment may further include, before the forming the gate electrode, forming a channel region of an amplifier transistor, and a channel region of a reset transistor configured to reset a potential of a gate electrode of the amplifier transistor by selectively implanting impurities of the first conductivity type into the semiconductor region. In the forming the channel region, the channel region of the amplifier transistor may be greater than a gate width of the amplifier transistor, and the channel region of the reset transistor may be greater than a gate width of the reset transistor.

As such, the channel regions of the amplifier transistor and the reset transistor are formed before the gate electrode, thereby preventing or reducing formation of regions under the gate electrodes, in which threshold voltages are partially lowered, due to misalignment, etc. As a result, the channel regions with uniform impurity concentrations, that is, uniform threshold voltages are reliably formed.

The method of manufacturing the solid-state imaging device according to the embodiment may further include, before the forming the gate electrode, forming a channel region of an amplifier transistor by selectively implanting impurities of the second conductivity type into the semiconductor region; and forming a channel region of a reset transistor configured to reset a potential of a gate electrode of the amplifier transistor by selectively implanting impurities of the first conductivity type into the semiconductor region. In the forming the channel region of the amplifier transistor, the channel region of the amplifier transistor may be smaller than a gate width of the amplifier transistor. In the forming the channel region of the reset transistor, the channel region of the reset transistor may be greater than a gate width of the reset transistor.

This reliably forms the channel region within the gate width of the amplifier transistor. As a result, formation of a leakage path between the source and drain regions outside the gate electrode is prevented or reduced.

The method of manufacturing the solid-state imaging device according to the embodiment may further include, before the forming the gate electrode, forming a channel region of an amplifier transistor by selectively implanting impurities of the second conductivity type into the semiconductor region; and forming a channel region of a reset transistor configured to reset a potential of a gate electrode of the amplifier transistor by selectively implanting impurities of the first conductivity type into the semiconductor region. In the forming the channel region of the amplifier transistor, the channel region of the amplifier transistor may be greater than a gate width of the amplifier transistor. In the forming the channel region of the reset transistor, the channel region of the reset transistor may be greater than a gate width of the reset transistor. A concentration of the impurities of the first conductivity type in the forming the isolation region may be higher than a concentration of the impurities of the second conductivity type in the forming the channel region of the amplifier transistor.

Then, the impurity implantation in forming the isolation region inverts the conductivity type, even if the channel region of the amplifier transistor is formed outside the gate electrode. This prevents or reduces formation of a leakage path between the source and drain regions outside the gate electrode. In addition, the resist pattern for forming the channel regions expands outside the gate electrode, thereby increasing the margin in lithography.

Embodiments of the present disclosure will be described hereinafter with reference to the drawings. The present disclosure is not limited to the following embodiments. Changes and modifications can be made within the scope of the present disclosure. One embodiment may be combined with other embodiments.

FIRST EMBODIMENT

FIG. 1 illustrates the circuit configuration of a solid-state imaging device according to a first embodiment.

As shown in FIG. 1, the solid-state imaging device according to the first embodiment is a multilayer solid-state imaging device. The device includes a photosensitive region (i.e., a pixel region) formed by arranging a plurality of unit pixels 13 in a matrix on a semiconductor substrate, and a drive circuit sequentially driving the plurality of unit pixels 13 to extract photoelectrically converted signals.

The drive circuit includes a vertical scanner (row scan circuit) 15, a photoelectric converter control line 16, a horizontal signal reader (column scan circuit) 20, column signal processors (row signal chargers) 19 connected to the horizontal signal reader 20, vertical signal lines (vertical signal interconnects) 17 connecting the column signal processors 19 to the unit pixels 13, loads 18 connected to the vertical signal lines 17, a power supply line (source follower power supply) 21 supplying a predetermined power supply voltage to the unit pixels 13, and differential amplifiers (feedback amplifiers) 23 connected to the vertical signal lines 17 at respective negative input terminals, and connected to the unit pixels 13 at respective output terminals via feedback lines 24.

Each unit pixel (unit cell) 13 includes a photoelectric converter 9, an amplifier transistor 10, a reset transistor 11, and an address transistor (row selection transistor) 12.

The photoelectric converter 9 photoelectrically converts incident light, and generates and accumulates signal charges corresponding to the amount of the incident light. The amplifier transistor 10 outputs a signal voltage corresponding to the amount of the signal charges generated by the photoelectric converter 9. The reset transistor 11 resets (initializes) the potential of the photoelectric converter 9, that is, a gate electrode of the amplifier transistor 10. The address transistor 12 selectively outputs a signal voltage from the corresponding unit pixel 13 of a predetermined row to the corresponding vertical signal line 17.

The vertical scanner 15 applies row selection signals controlling on/off of the address transistors 12 to the gate electrodes of the address transistors 12, thereby scanning the rows of the unit pixels 13 in the vertical direction (i.e., the column direction). Then, the vertical scanner 15 selects one of the rows of the unit pixels 13 to output the signal voltage to the corresponding vertical signal line 17. The vertical scanner 15 applies reset signals controlling on/off of the reset transistors 11 to the gate electrodes of the reset transistors 11, thereby selecting one of the rows of the unit pixels 13 to perform reset operation.

The photoelectric converter control line 16 is connected in common to all of the unit pixels 13, and applies the same constant positive voltage to all of the photoelectric converters 9.

The vertical signal lines 17 correspond to the columns of the unit pixels 13. The vertical signal lines 17 are connected to source regions of the address transistors 12 of the unit pixels 13 of the corresponding columns. The vertical signal lines 17 are aligned in the column direction and transmit signal voltages in the column direction (i.e., the vertical direction).

Each of the loads 18 is connected to a corresponding one of the vertical signal lines 17. Each load 18 forms a source follower circuit together with the amplifier transistor 10.

The column signal processors 19 performs noise suppression represented by correlated double sampling, analog-to-digital conversion, etc. Each of the column signal processors 19 is connected to a corresponding one of the vertical signal lines 17.

The horizontal signal reader 20 sequentially reads signals of the plurality of column signal processors 19 aligned in the horizontal direction (i.e., the row direction) on a common horizontal signal line (not shown).

The power supply line 21 is connected to drain regions of the amplifier transistors 10 and provided in the vertical direction (i.e., the vertical direction in FIG. 1) of the unit pixels 13 in the photosensitive region. The reason follows. The unit pixels 13 are addressed on a row-by-row basis. If the power supply line 21 is provided in the row direction (i.e., the horizontal direction), all of the pixel drive currents of a single row flow through a single interconnect to increase voltage drop. The power supply line 21 applies a source follower power supply voltage to the amplifier transistors 10 of all of the unit pixels 13 in common.

The differential amplifiers 23 correspond to the columns of the unit pixels 13. The output terminal of each differential amplifier 23 is connected to drain regions of the reset transistors 11 via the corresponding feedback line 24. When the address transistors 12 and the corresponding reset transistor 11 are on, the differential amplifier 23 receives the output value of the address transistor 12 at a negative terminal, and performs feedback operation such that the gate potential of the amplifier transistor 10 is a predetermined feedback voltage (i.e., the output voltage of the differential amplifier 23). At this time, the output voltage of the differential amplifier 23 is 0 V or a positive voltage close to 0 V.

In the solid-state imaging device with the above-described configuration, in the unit pixels 13 of one row selected by the vertical scanner 15, the signal charges photoelectrically converted by the photoelectric converters 9 are amplified by the amplifier transistors 10 and output to the corresponding vertical signal line 17 via the address transistors 12.

The output signal charges are accumulated as electric signals in the corresponding column signal processor 19, and then selected and output by the horizontal signal reader 20. The signal charges of the unit pixels 13, which have output the signals, are released when the reset transistors 11 are on. At this time, the reset transistors 11 generate great thermal noise called "kTC noise." This thermal noise turns the reset transistors 11 off, and remains at the start of accumulating the signal charges. In order to reduce the thermal noise, the output values of the vertical signal lines 17 are inverted and amplified by the differential amplifiers 23, and the inverted and amplified signals are fed back to the drain regions of the reset transistors 11 via the feedback lines 24.

As such, negative feedback control reduces the thermal noise generated by the reset transistors 11. Out of the thermal noise, the AC component is fed back to the drain regions of the reset transistors 11, and the DC component has, as described above, the positive voltage close to 0 V.

Figure 2:
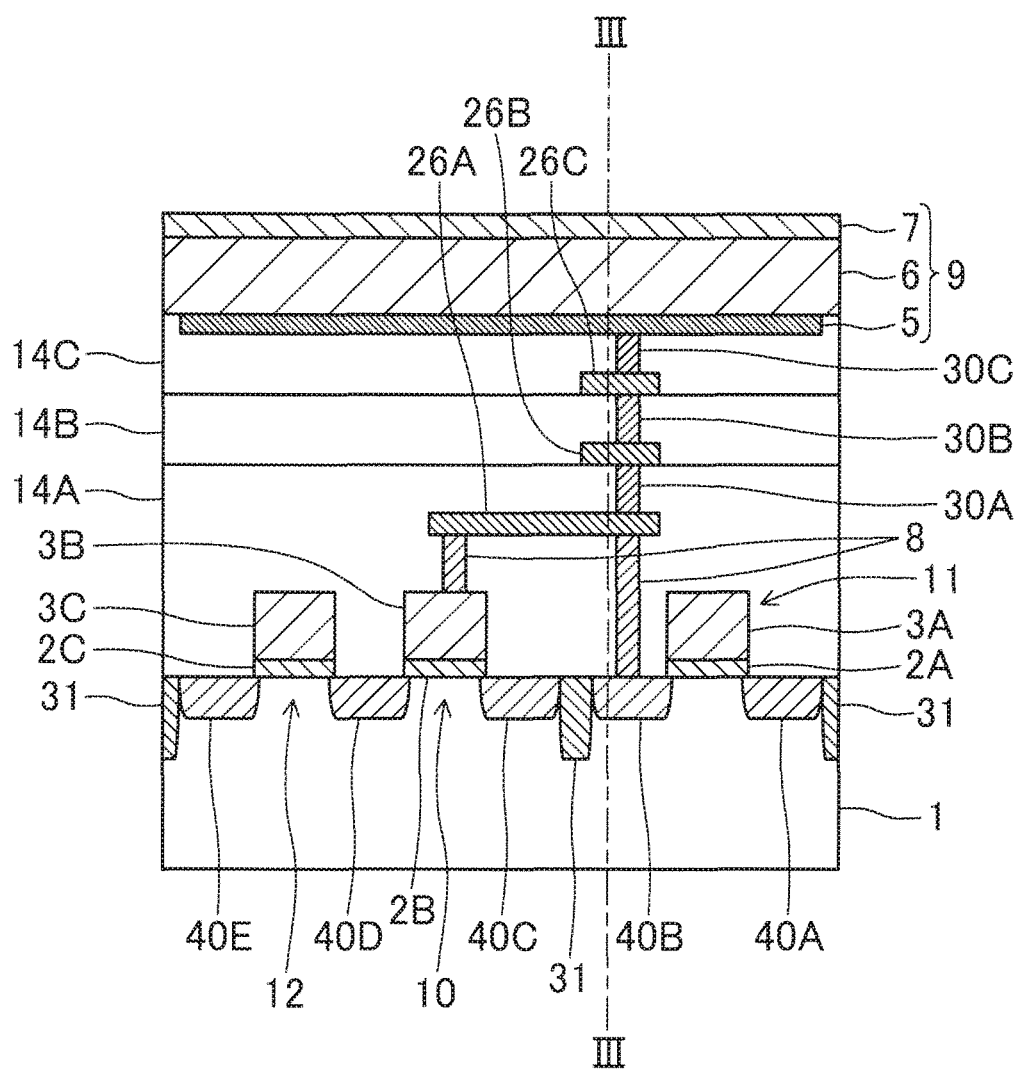
FIG. 2 is a schematic cross-sectional view illustrating one unit pixel in the solid-state imaging device according to the first embodiment.

FIG. 2 illustrates the schematic cross-sectional structure of one of the unit pixels 13 in the solid-state imaging device according to this embodiment. Three transistors are shown in one cross-section to simplify the description, which is different from the actual structure.

The unit pixel 13 includes, for example, a pixel circuit of three transistors formed on the semiconductor substrate 1 made of p-type silicon (Si), that is, the address transistor 12, the amplifier transistor 10, and the reset transistor 11. The unit pixel 13 further includes, an isolation region 31, interlayer insulating films 14A, 14B, and 14C stacked on the semiconductor substrate 1 in this order, and the photoelectric converter 9. The photoelectric converter 9 includes a pixel electrode 5 in an upper portion of the interlayer insulating film 14C, a photoelectric conversion film 6 formed on the pixel electrode 5, and a transparent electrode 7 formed on the photoelectric conversion film 6.

In the unit pixel 13, the reset transistor 11 includes n-type impurity regions 40A and 40B formed in upper portions of the semiconductor substrate 1, and a gate insulating film 2A and a gate electrode 3A formed on and above the semiconductor substrate 1. Similarly, the amplifier transistor 10 includes n-type impurity regions 40C and 40D formed in upper portions of the semiconductor substrate 1, and a gate insulating film 2B and a gate electrode 3B formed on and above the semiconductor substrate 1. The address transistor 12 includes n-type impurity regions 40D and 40E formed in upper portions of the semiconductor substrate 1, and a gate insulating film 2C and a gate electrode 3C formed on and above the semiconductor substrate 1.

The isolation region 31 is an impurity diffusion region which insulates and isolates the transistors 10 and 12 from the transistor 11. For example, the isolation region 31 is formed between and around the amplifier transistor 10 and the reset transistor 11 in an upper portion of the semiconductor substrate 1 to electrically isolate the amplifier transistor 10 from the reset transistor 11.

The n-type impurity region 40A functions as the source region of the reset transistor 11. The n-type impurity region 40B functions as the drain region of the reset transistor 11. In the solid-state imaging device according to this embodiment, holes are used as the signal charges, and thus a source and a drain are in the interchanged positions of those in a sensor using electrons as signal charges. The n-type impurity region 40C functions as the drain region of the amplifier transistor 10. The n-type impurity region 40D functions as the source region of the amplifier transistor 10 and the drain region of the address transistor 12. The n-type impurity region 40E functions as the source region of the address transistor 12.

The impurity concentration of the semiconductor substrate 1 is, for example, about $1 \times 10^{17}$ cm$^{-3}$. The impurity concentrations of the n-type impurity regions 40A, 40C, 40D, and 40E range from about $1 \times 10^{20}$ cm$^{-3}$ to about $1 \times 10^{22}$ cm$^{-3}$. The impurity concentration of the n-type impurity region 40B is about $1 \times 10^{18}$ cm$^{-3}$. The thicknesses of the gate insulating films 2A, 2B, and 2C respectively formed under the gate electrodes 3A, 3B, and 3C range from 4 nm to 10 nm.

The photoelectric conversion film 6 is made of an organic material, amorphous silicon, etc., and formed above the semiconductor substrate 1 to photoelectrically convert incident light from the outside. The pixel electrode 5 is in contact with the surface of the photoelectric conversion film 6, which is closer to the semiconductor substrate 1, that is, on the back surface of the photoelectric conversion film 6 to collect the signal charges generated in the photoelectric conversion film 6. The transparent electrode 7 is in contact with the surface of the photoelectric conversion film 6, which is opposite to the pixel electrode 5, that is, on the front surface of the photoelectric conversion film 6. A constant positive voltage is applied to the transparent electrode 7 via the photoelectric converter control line 16. The signal charges generated in the photoelectric conversion film 6 are read on the pixel electrode 5.

The amplifier transistor 10 is a MOS transistor formed in the semiconductor substrate 1 below the pixel electrode 5. The amplifier transistor 10 includes the gate electrode 3B connected to the pixel electrode 5, and outputs a signal voltage corresponding to the potential of the pixel electrode 5.

The reset transistor 11 is a MOS transistor formed in the semiconductor substrate 1 below the pixel electrode 5. The reset transistor 11 includes the drain region (i.e., the n-type impurity region 40B) connected to the pixel electrode 5 and formed in the region of the semiconductor substrate 1 between the gate electrode 3A and the isolation region 31. The reset transistor 11 resets the potential of the gate electrode 3B of the amplifier transistor 10 to a reset voltage, that is, a feedback voltage.

The address transistor 12 is a MOS transistor formed in the semiconductor substrate 1 below the pixel electrode 5. The address transistor 12 is provided between the amplifier transistor 10 and the vertical signal line 17, and outputs a signal voltage from the unit pixel 13 to the vertical signal line 17. While the address transistor 12 is interposed between the source region of the amplifier transistor 10 and the vertical signal line 17, it may be interposed between the drain region of the amplifier transistor 10 and the power supply line 21.

The gate electrode 3B of the amplifier transistor 10 as well as the drain region (i.e., the n-type impurity region) 40B of the reset transistor 11 are connected to the pixel electrode 5 via contact plugs 8, an interconnect 26A, a plug 30A, an interconnect 26B, a plug 30B, an interconnect 26C, and a plug 30C. The pn junction between the n-type impurity region 40B connected to the pixel electrode 5 and the semiconductor substrate 1 forms a parasitic diode (accumulation diode) accumulating signal charges. The accumulation diode is also referred to as a floating diffusion (FD).

Figure 3:
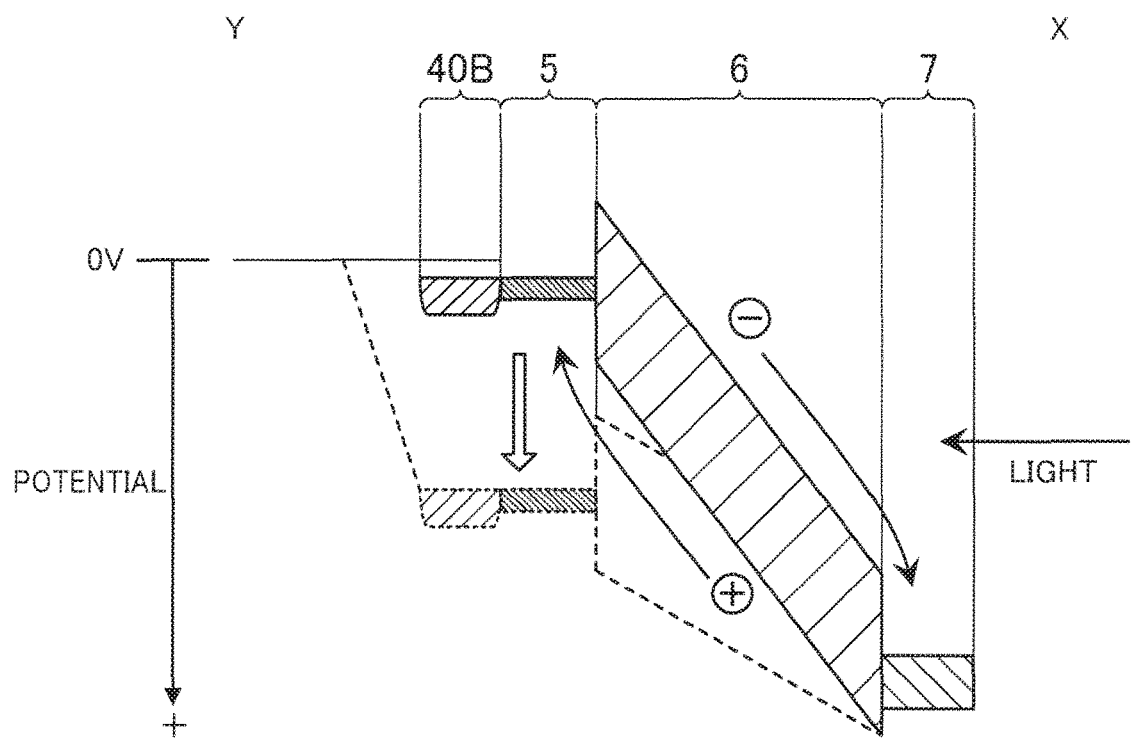
FIG. 3 is a schematic view illustrating the potential of the unit pixel according to the first embodiment at the portion along the line III-III of FIG. 2.

FIG. 3 schematically illustrates the potential of the unit pixel 13, specifically, the potential of the portion along the line III-III of FIG. 2.

As shown in FIG. 3 and as described above, the positive voltage is applied to the transparent electrode 7. In a no-signal state (in a reset state), a little reverse bias voltage is applied to the n-type impurity region 40B being an accumulation diode, and the potential of the n-type impurity region 40B becomes almost 0 V. At this time, the positive voltage of the transparent electrode 7 draws the potential of the pixel electrode 5 and the n-type impurity region 40B in the positive direction. In this state, when the n-type impurity region 40B has low potential close to 0 V, a bias charge is applied to the n-type impurity region 40B. Thus, the suitable potential of the n-type impurity region 40B is about 0.1 V or higher with low reverse bias. The value close to 0 V is determined to reduce reverse direction leakage currents (dark currents) flowing between the accumulation diode and the semiconductor substrate 1.

The light incident from a portion above the transparent electrode 7 (i.e., from the X direction) is transmitted by the transparent electrode 7, incident on the photoelectric conversion film 6, and converted to electron-hole pairs. The electrons of the converted electron-hole pairs are transferred to the transparent electrode 7 and flow to the power supply line 21 connected to the transparent electrode 7. On the other hand, the holes of the electron-hole pairs are transferred toward the accumulation diode (i.e., the n-type impurity region 40B) and accumulated in the accumulation diode. Thus, the potential of the accumulation diode changes to positive, and a voltage is applied between the accumulation diode and the semiconductor substrate 1. At this time, the reverse direction leakage current (i.e., a dark current) flows between the accumulation diode and the semiconductor substrate 1 and becomes noise. However, where a signal exists, noise is not significant or problematic.

The voltage, which has been changed to positive by the holes accumulated in the accumulation diode, is transmitted to the gate electrode 3B of the amplifier transistor 10. The signal transmitted to the gate electrode 3B and amplified by the amplifier transistor 10 passes through the address transistor 12 and is output to the outside of the unit pixel 13, that is, to the vertical signal line 17. After that, the signal charge accumulated in the accumulation diode is released by turning on the reset transistor 11. At this time, the gate electrode 3B of the amplifier transistor 10 is reset to have a voltage lower than the voltage applied to the transparent electrode 7.

The multilayer solid-state imaging device according to this embodiment requires a signal charge time one-digit longer than conventional MOS image sensors. There is thus a need to reduce leakages in accumulating, and differences in operational characteristics among the amplifier transistors 10.

Figure 4:
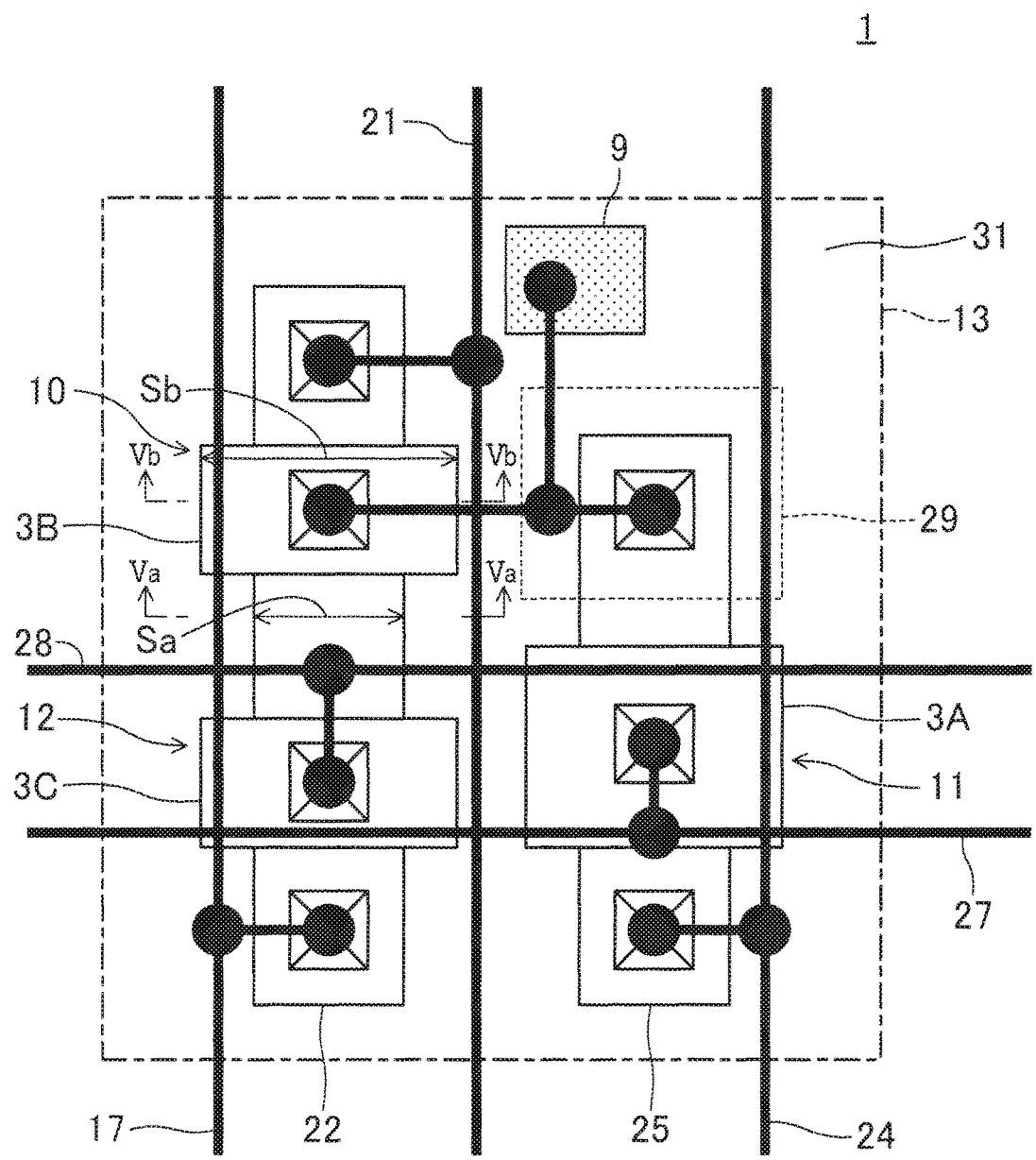
FIG. 4 is a schematic top view illustrating the configuration of the unit pixel according to the first embodiment.

FIG. 4 illustrates the configuration of each unit pixel 13 viewed in plan.

As shown in FIG. 4, in the unit pixel 13, the active regions of the amplifier transistor 10 and the address transistor 12 are formed in the semiconductor substrate 1 in a first active region 22 surrounded by the isolation region 31. The active region of the reset transistor 11 is formed in the semiconductor substrate 1 in a second active region 25 surrounded by the isolation region 31. The "active region" here includes the source region, the drain region, and the gate region (i.e., the channel region).

The source region of the address transistor 12 is connected to the vertical signal line 17. The gate electrode 3C is connected to an address signal line 28. The drain region of the amplifier transistor 10 is connected to the power supply line 21. The drain region of the reset transistor 11 is electrically connected to the gate electrode 3B of the amplifier transistor 10 and drawn to the portion above the semiconductor substrate 1 to be connected to the photoelectric converter 9. The reset transistor 11 is formed in the second active region 25 electrically isolated from the first active region 22 by the isolation region 31. The source region of the reset transistor 11 is connected to the feedback line 24. The gate electrode 3A of the reset transistor 11 is connected to a reset signal line 27. A leakage current is problematic in a reset transistor drain peripheral region 29 surrounding the drain region of the reset transistor 11.

As such, the isolation region 31 electrically isolating the first active region 22 from the second active region 25 is formed in the semiconductor substrate 1 between and around the first active region 22 and the second active region 25. In the width direction of the gate electrodes (hereinafter referred to as a "gate width direction") in the isolation region 31, a gap Sb including the channel region and indicated by the line Vb-Vb is wider than a gap Sa including the drain region.

Thus, in the gate width direction in the isolation region 31, the gap Sb including the channel region of the transistor is designed wider than the gap Sa including the source/drain region, thereby reducing the alignment budgets of each layer and between the layers. As a result, the unit pixel 13 is miniaturized.

Specifically, the area of the isolation region 31 between the first active region 22 and the second active region 25 needs to be reduced to miniaturize the unit pixel 13. Thus, the pixel needs to be designed on a layer-by-layer basis in view of accuracy in alignment for exposure, in a size, in a mask, in layer alignment, etc., in forming a pattern.

For example, in the region corresponding to the line Va-Va of FIG. 4, the accuracy in the mask, in the alignment for exposure, and in the resist size of the layer forming the isolation region 31 and the layer forming the source/drain region may be considered. In addition, the alignment budgets of the two layers and the alignment budget between the two layers may be considered.

Similarly, in the region corresponding to the line Vb-Vb of FIG. 4, the accuracy in the mask, in the alignment for exposure, and in the resist size of the layer forming the channel region under the gate electrode 3B and the layer forming the gate electrode 3B may be considered. In addition, the alignment budgets of the two layers and the alignment budget between the two layers may be considered. In short, in the structure according to this embodiment, the alignment budget of the two layers may be considered in the regions corresponding to the lines Va-Va and Vb-Vb.

By contrast, in the structure shown in Japanese Patent No. 4420039, the region corresponding to the line Va-Va is similar to that in this embodiment. However, in the region corresponding to the line Vb-Vb, the accuracy in the mask, in the alignment for exposure, and in the resist size of the layer forming the channel region under the gate electrode, the layer forming the isolation region, and the layer forming the gate electrode need to be considered. In addition, the alignment budgets of the three layers and the alignment budget among the three layers need to be considered. As such, the alignment budget as a whole increases, and miniaturization in the unit pixels becomes difficult as compared to this embodiment.

Figure 5A:
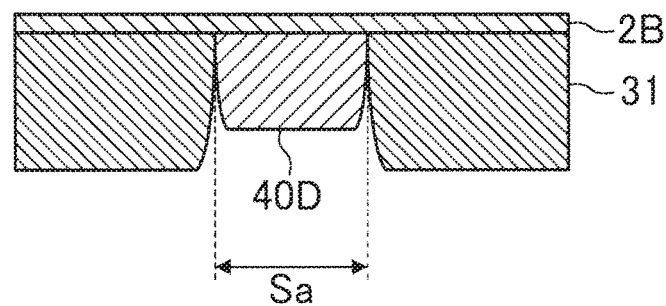
FIGS. 5A and 5B are schematic views of an active region and an isolation region of the unit pixel according to the first embodiment.
Figure 5B:
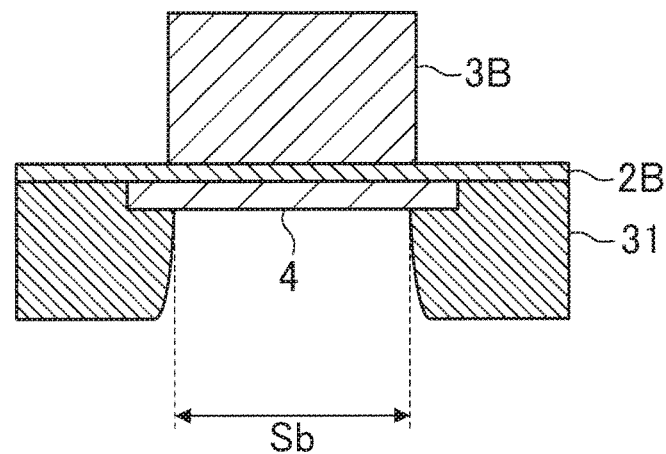

FIGS. 5A and 5B illustrate the cross-sectional structure of the amplifier transistor 10 in the gate width direction. FIG. 5A is a cross-sectional view taken along the line Va-Va of FIG. 4. FIG. 5B is a cross-sectional view taken along the line Vb-Vb of FIG. 4.

As shown in FIGS. 5A and 5B, in the gate width direction in the isolation region 31, the gap Sb including the channel region 4 formed in the first active region 22 is wider than the gap Sa including the n-type impurity region 40D formed in the first active region 22.

In the first embodiment, an example has been described where the transistors of the pixel circuit, that is, the amplifier transistor 10, the reset transistor 11, and the address transistor 12 are n-type MOS transistors. The channel regions of the transistors are subjected to regular doping implanting p-type impurity ions. As such, in performing regular doping to form the channel region 4, as shown in FIG. 5B, the channel region 4 needs to have portions at the both ends in the gate width direction, which overlap the isolation region 31.

The width of the channel region 4 in the gate width direction is preferably designed greater than the width of the gate electrode 3B. If the width of the channel region 4 is smaller than the width of the gate electrode 3B, part of the region directly under the gate electrode 3B is not subjected to the p-type impurity ion implantation for forming the channel. In this case, a region with a low threshold voltage (Vth) is formed in the transistor and the threshold voltage cannot be controlled to a desired value.

Method of Manufacturing in First Embodiment

A method of manufacturing the solid-state imaging device according to the first embodiment with the above-described structure will be roughly described hereinafter with reference to FIGS. 6A-6D.

Figure 6A:
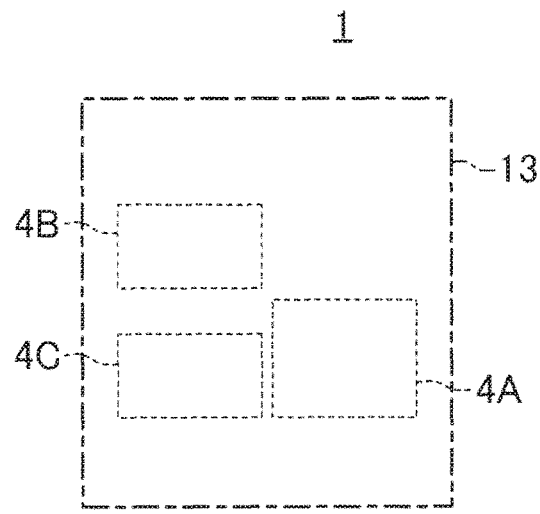
FIGS. 6A-6D are top views illustrating a method of manufacturing the solid-state imaging device according to the first embodiment in order of steps.

First, as shown in FIG. 6A, a resist pattern for forming the channel regions of the transistors (10, 11, and 12) of the pixel circuit is formed on the semiconductor substrate 1 made of, for example, p-type silicon (Si) by lithography. After that, p-type impurity ions are implanted under predetermined implantation conditions using the formed resist pattern as a mask, thereby forming the channel regions 4A, 4B, and 4C. Then, the transistors of the pixel circuit have desired threshold voltages. At this time, the channel regions 4A, 4B, and 4C respectively have greater widths than the gate electrodes 3A, 3B, and 3C formed thereon.

Figure 6B:
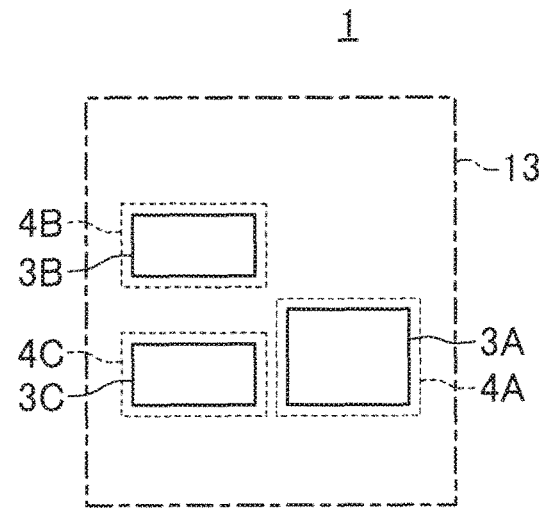

Next, as shown in FIG. 6B, a gate insulating film (not shown) made of oxide silicon is formed on the principal surface of the semiconductor substrate 1 by gate oxidation such as in-situ steam generation (ISSG). Then, a gate formation film made of, for example, polysilicon, is deposited on the gate insulating film by chemical vapor deposition (CVD). After that, a resist pattern for forming the gate electrodes is formed on the gate formation film by lithography. Then, the gate electrodes 3A, 3B, and 3C are formed from the gate formation film by dry etching using the resist pattern as a mask. As such, the channel regions 4A, 4B, and 4C of the transistors are formed before the gate electrodes 3A, 3B, and 3C. This prevents or reduces formation of the regions directly under the gate electrodes 3A, 3B, and 3C, in which threshold voltages are partially lowered, due to misalignment, etc. As a result, the channel regions with uniform impurity concentrations, that is, uniform threshold voltages are reliably formed.

Figure 6C:
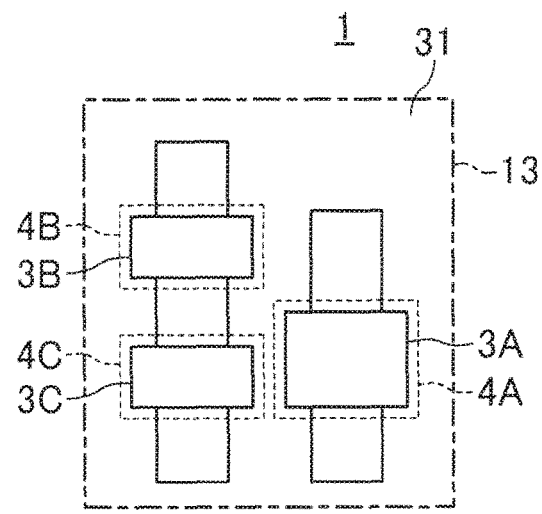

Next, as shown in FIG. 6C, a resist pattern masking the source/drain regions of the transistors of the pixel circuit is formed by lithography. After that, p-type impurity ions are implanted under predetermined implantation conditions using the formed resist pattern as a mask, thereby forming the isolation region 31. At this time, the p-type impurity ions for forming the isolation region are not directly implanted into the portions directly under the gate electrodes 3A, 3B, and 3C. Thus, the isolation region 31 surrounds the source/drain regions and the channel regions, and thus extends at the both sides of the source/drain regions and the channel regions in the gate width direction.

Depending on the planar shapes of the gate electrodes 3A, 3B, and 3C, which function as a mask in ion implantation, the end surface of the isolation region 31 in the gate width direction may be spaced apart from the channel regions. In this case, as well, the end surface of the gate electrode 3A, etc., in the gate width direction forms the same plane as the end surface of the isolation region 31. The "same plane" here includes shift of about tens of nm caused by thermal diffusion of the impurity ions, and may be almost the same plane.

In the ion implantation for forming the isolation region, the p-type impurity ions can be implanted in the regions under the gate electrodes 3A, 3B, and 3C by inclined implantation implanting ions into a substrate surface at a predetermined degree. However, in this case, the widths of the diffusion layers of the source/drain regions decrease similarly. Thus, as shown in FIG. 5A, the relation between the gap Sa and the gap Sb is unchanged. That is, in the gate width direction in the first active region 22 of the isolation region 31, the gap Sb including the channel region 4 is wider than the gap Sa including the n-type impurity region 40D.

Figure 6D:
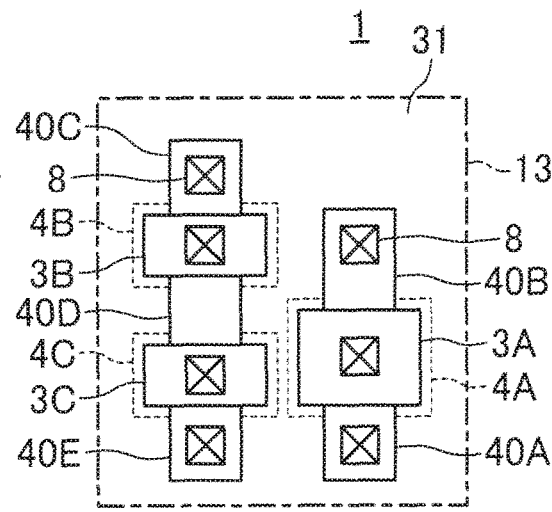

Next, as shown in FIG. 6D, a resist pattern exposing the source/drain formation regions of the transistors of the pixel circuit is formed by lithography. After that, n-type impurity ions are implanted under predetermined implantation conditions using the formed resist pattern and the gate electrodes 3A, 3B, and 3C as a mask, thereby forming the n-type impurity regions 40A, 40B, 40C, 40D, and 40E. At this time, n-type impurity ions may be implanted into the gate electrodes 3A, 3B, and 3C, that is, gate implantation may be performed. If the gate implantation is not performed at this time, the gate implantation may be performed after depositing the gate formation film made of polysilicon in the step shown in, for example, FIG. 6B. The n-type impurity regions 40A, 40B, 40C, 40D, and 40E are here formed at once. However, the n-type impurity regions 40A, 40C, 40D, and 40E are preferably formed separately from the n-type impurity region 40B by lithography and impurity ion implantation using a different mask to reduce leakage currents at the n-type impurity region 40B.

Then, an interlayer insulating film made of oxide silicon, etc., is formed on the semiconductor substrate 1 by CVD to cover the gate electrodes 3A, 3B, and 3C. After that, a resist pattern forming contact holes is formed on the interlayer insulating film by lithography. Dry etching is performed using the formed resist pattern as a mask to form contact holes above the gate electrodes 3A, 3B, and 3C and the n-type impurity regions 40A, 40B, 40C, and 40E. Then, n-type impurity ions are implanted through the formed contact holes to form an $n^+$ impurity region (not shown) in the upper portions of the gate electrodes 3A, 3B, and 3C and the n-type impurity regions 40A, 40B, 40C, and 40E exposed from the respective contact holes. Annealing is then performed to activate the implanted impurity ions, thereby reducing resistance. Next, a polysilicon film containing $n^+$-type impurities is deposited on the interlayer insulating film by CVD, etc., to bury the contact holes. After that, the deposited polysilicon film is etched back or polished by chemical mechanical polishing (CMP) to form each contact plug 8.

Next, the interconnect 26A connected to the contact plugs 8, the plug 30A connected to the interconnect 26A, the interconnect 26B connected to the plug 30A, the plug 30B connected to the interconnect 26B, the interconnect 26C connected to the plug 30B, the plug 30C connected to the interconnect 26C are formed above the semiconductor substrate 1 in this order, while stacking the interlayer insulating films 14A, 14B, and 14C. After that, the pixel electrode 5 connected to the plug 30C, the photoelectric conversion film 6, the transparent electrode 7, a protection film (not shown), a color filter (not shown), and lenses (not shown) are formed on the interlayer insulating film 14C in this order. As a result, the solid-state imaging device shown in in FIG. 2 is formed. How to fabricate these elements is similar to that of the conventional multilayer solid-state imaging devices, and thus a detailed description is omitted.

In the MOS solid-state imaging device according to the first embodiment, the isolation region, which is in contact with the n-type semiconductor region forming the accumulation diode region (the FD), is a p-type diffusion isolation region. This reduces leakage currents from the FD, thereby reducing dark currents and white spots.

After forming the gate electrodes, the p-type diffusion isolation region is formed using the formed gate electrodes as a mask, thereby reducing the influence of the diffused impurities from the diffusion isolation region to the channel regions. This secures desired channel widths and reduces differences in the threshold voltage (Vth) and noise such as 1/f noise. As a result, the solid-state imaging device with an improved S/N ratio is provided.

In view of the overlap between the gate electrodes and the channel regions, the protrusion of the gates can be minimized. This reduces an increase in the gate capacity, which is problematic in the conventional multilayer solid-state imaging devices to improve the efficiency in photoelectrical conversion. As a result, the sensitivity of the solid-state imaging device improves.

SECOND EMBODIMENT

A solid-state imaging device according to a second embodiment will be described hereinafter with reference to FIG. 7.

In this embodiment, different from the first embodiment, channel regions are formed by implanting n-type impurity ions, that is, by performing what is called counter doping to obtain an n-type transistor with a low threshold voltage.

Furthermore, different from the first embodiment, the channel regions, into which the n-type impurity ions are implanted, are smaller than gate widths. This prevents or reduces formation of a leakage path between source and drain regions outsides gate electrodes.

Differences from first embodiment will be described below together with a manufacturing method.

Figure 7A:
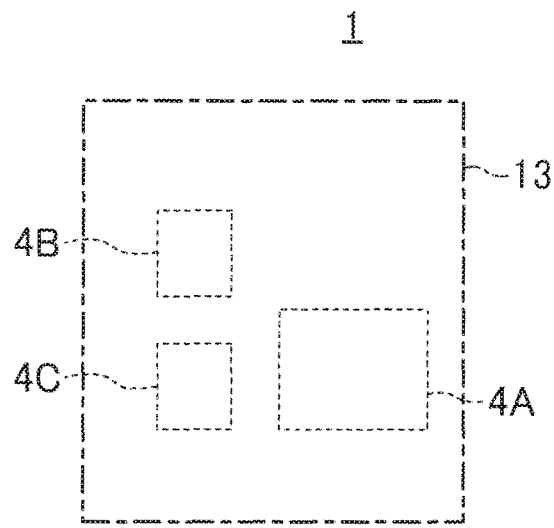
FIGS. 7A-7D are top views illustrating a method of manufacturing a solid-state imaging device according to a second embodiment in order of steps.

First, as shown in FIG. 7A, a resist pattern for forming channel regions of transistors (10, 12) of a pixel circuit is formed on a semiconductor substrate 1 made of, for example, p-type silicon by lithography. At this time, channel regions 4B and 4C are formed to have smaller widths than gate electrodes 3B and 3C respectively formed thereon. After that, n-type impurity ions are implanted under predetermined implantation conditions using the formed resist pattern as a mask, thereby forming the channel regions 4B and 4C. Then, a resist pattern for forming the channel region of a transistor (11) is formed. In this case, similar to the first embodiment, a channel region 4A is formed to have a greater width than a gate electrode 3A formed thereon. After that, p-type impurity ions are implanted under predetermined implantation conditions using the formed resist pattern as a mask, thereby forming the channel region 4A. As a result, the transistors of the pixel circuit have desired threshold voltages.

Figure 7B:
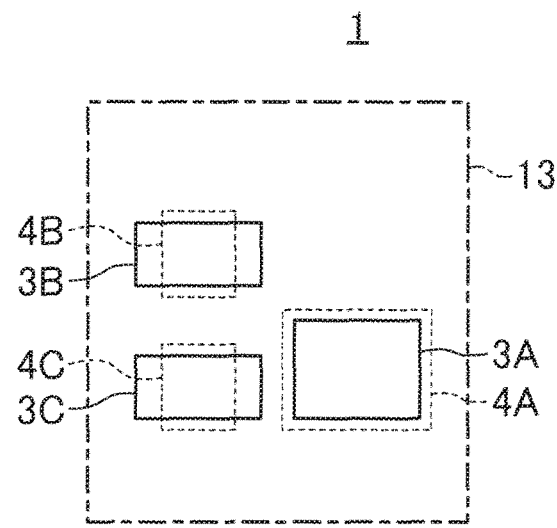

Next, as shown in FIG. 7B, a gate insulating film (not shown) made of oxide silicon is formed on the principal surface of the semiconductor substrate 1 by gate oxidation such as ISSG. Then, a gate formation film made of, for example, polysilicon, is deposited on the gate insulating film by CVD. After that, a resist pattern for forming the gate electrodes is formed on the gate formation film by lithography. Then, the gate electrodes 3A, 3B, and 3C are formed from the gate formation film by dry etching using the resist pattern as a mask. At this time, different from the first manufacturing method, the channel regions 4B and 4C are included in the gate electrodes 3B and 3C as viewed in plan in the gate width direction of the channel regions 4B and 4C.

Figure 7C:
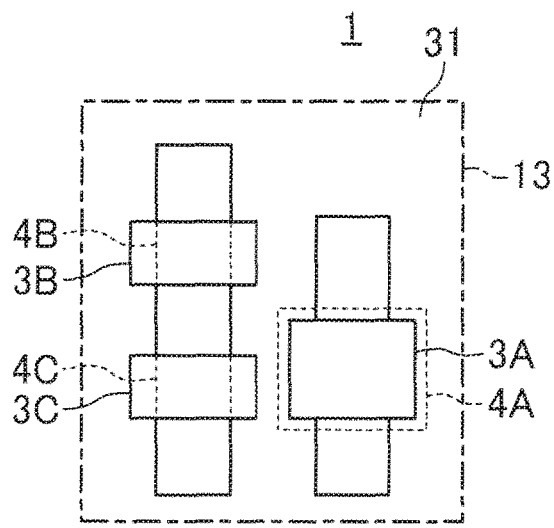

Then, as shown in FIG. 7C, a resist pattern masking the source/drain regions of the transistors of the pixel circuit is formed by lithography. After that, p-type impurity ions are implanted under predetermined implantation conditions using the formed resist pattern as a mask, thereby forming an isolation region 31. Then, the isolation region 31 surrounds the source/drain regions and the channel regions.

Figure 7D:
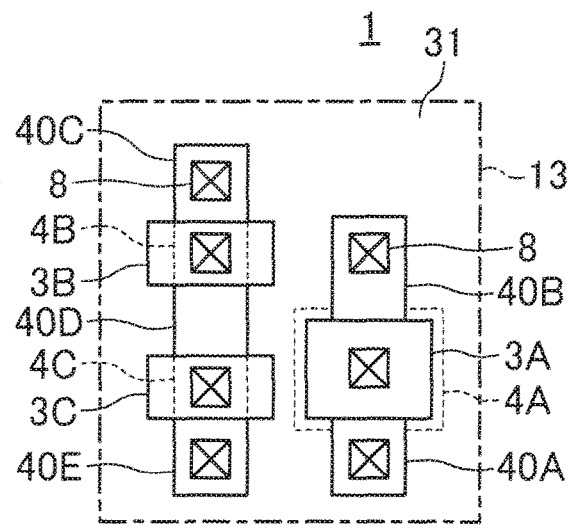

Next, as shown in FIG. 7D, a resist pattern exposing the source/drain formation regions of the transistors of the pixel circuit is formed by lithography. After that, n-type impurity ions are implanted under predetermined implantation conditions using the formed resist pattern and the gate electrodes 3A, 3B, and 3C as a mask, thereby forming the n-type impurity regions 40A, 40B, 40C, 40D, and 40E.

While in this embodiment, the channel regions 4B and 4C are formed only in the amplifier transistor and the address transistor by counter doping, the formation is not limited thereto. Specifically, whether the channels of the n-type transistors of the pixel circuit are subjected to p-type impurity ion implantation (i.e., regular doping) or n-type impurity ion implantation (i.e., counter doping) may be selected in accordance with desired threshold voltages. The doping is not limited to the above-described combination.

Variation of Second Embodiment

A solid-state imaging device according to a variation of the second embodiment will be described below with reference to FIG. 8.

In this variation, different from the second embodiment, n-type impurity ion implantation regions for forming channel regions are greater than gate widths. This extends a resist pattern for forming the channel regions outside gate electrodes, thereby increasing the margin in lithography.

In order to provide the structure, the amount of the n-type impurity ions implanted to form the channel regions is greater than the amount of the p-type impurity ions implanted to form the isolation region. With this feature, for example, an amplifier transistor and an address transistor have low threshold voltages.

Differences from the second embodiment will be described below together with a manufacturing method.

Figure 8A:
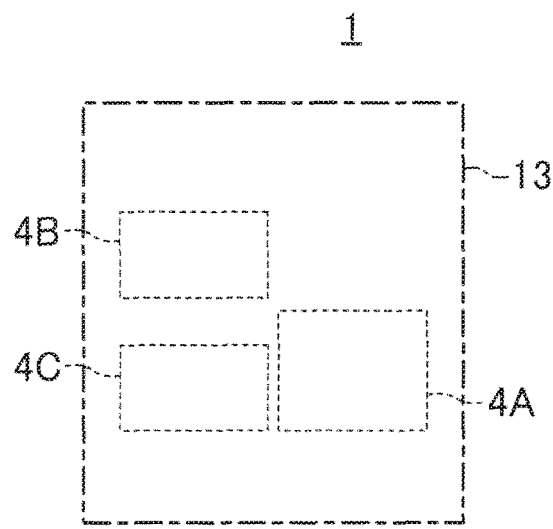
FIGS. 8A-8D are top views illustrating a method of manufacturing a solid-state imaging device according to a variation of the second embodiment in order of steps.

First, as shown in FIG. 8A, a resist pattern for forming channel regions of transistors (10 and 12) of a pixel circuit is formed on a semiconductor substrate 1 made of, for example, p-type silicon by lithography. At this time, channel regions 4B and 4C are formed to have greater widths than gate electrodes 3B and 3C. After that, n-type impurity ions are implanted under predetermined implantation conditions using the formed resist pattern as a mask, thereby forming the channel regions 4B and 4C. Then, a resist pattern for forming the channel region of a transistor (11) is formed. The channel region 4A also has a greater width than a gate electrode 3A. After that, p-type impurity ions are implanted under predetermined implantation conditions using the formed resist pattern as a mask, thereby forming the channel region 4A. As a result, the transistors of the pixel circuit have desired threshold voltages.

Figure 8B:
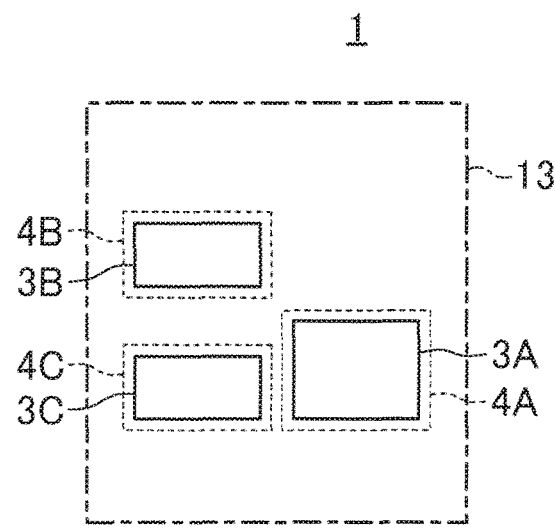

Next, as shown in FIG. 8B, a gate insulating film (not shown) made of oxide silicon is formed on the principal surface of the semiconductor substrate 1 by gate oxidation such as ISSG. Then, a gate formation film made of, for example, polysilicon, is deposited on the gate insulating film by CVD. After that, a resist pattern for forming the gate electrodes is formed on the gate formation film by lithography. Then, the gate electrodes 3A, 3B, and 3C are formed from the gate formation film by dry etching using the resist pattern as a mask. At this time, different from the second manufacturing method, the gate electrodes 3B and 3C are included in the channel regions 4B and 4C as viewed in plan in the gate width direction of the channel regions 4B and 4C.

Figure 8C:
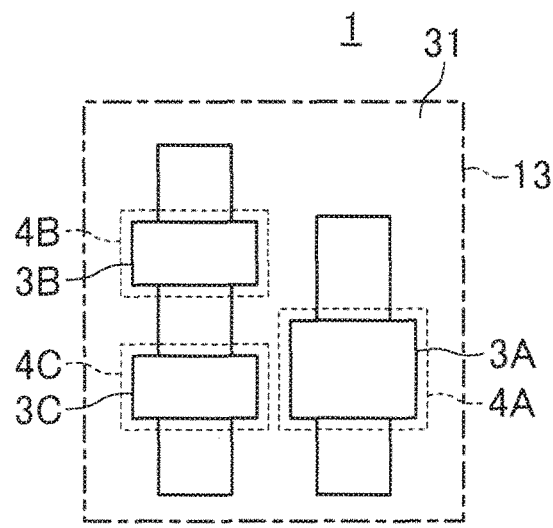

Then, as shown in FIG. 8C, a resist pattern masking source/drain regions of the transistors of the pixel circuit is formed by lithography. After that, p-type impurity ions are implanted under predetermined implantation conditions using the formed resist pattern as a mask, thereby forming an isolation region 31. Then, the isolation region 31 surrounds the source/drain regions and the channel regions. At this time, the amount of the n-type impurity ions implanted to form the channel regions is greater than the amount of the p-type impurity ions implanted to form the isolation region. With this configuration, the conductivity of the n-type impurity ions used for counter doping is inverted due to the p-type impurity ions for forming the isolation regions. This prevents or reduces formation of the channel regions around the gate electrodes 3B and 3C.

Figure 8D:
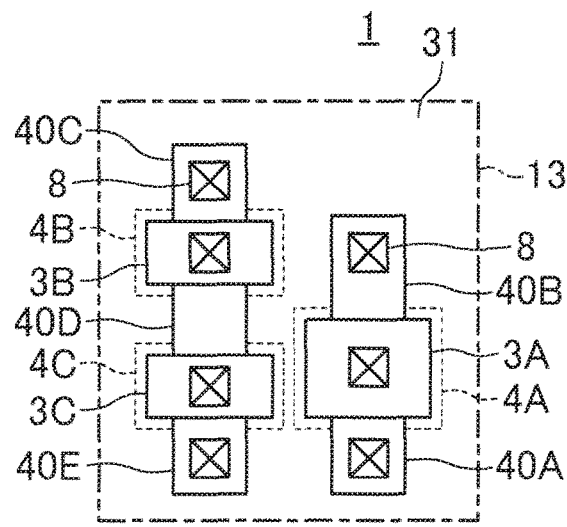

Next, as shown in FIG. 8D, a resist pattern exposing the source/drain formation regions of the transistors of the pixel circuit is formed by lithography. After that, n-type impurity ions are implanted under predetermined implantation conditions using the formed resist pattern and the gate electrodes 3A, 3B, and 3C as a mask, thereby forming n-type impurity regions 40A, 40B, 40C, 40D, and 40E.

While in this variation as well, the channel regions 4B and 4C are formed only in the amplifier transistor and the address transistor by counter doping, the formation is not limited thereto. Specifically, whether the channels of the n-type transistors of the pixel circuit are subjected to p-type impurity ion implantation (i.e., regular doping) or n-type impurity ion implantation (i.e., counter doping) may be selected in accordance with desired threshold voltages. The doping is not limited to the above-described combination.

While the solid-state imaging devices according to the first embodiment, the second embodiment, and its variation have been described as above, the present disclosure is not limited to these embodiments.

For example, in the above-described embodiments, the first conductivity type is the p type and the second conductivity type is the n type. For example, the conductivity type of the semiconductor substrate 1 made of silicon is the p type, and the transistors 10, 11, and 12 of the pixel circuit are of the n-channel type. Alternatively, the conductivity type of the semiconductor substrate 1 may be the n type, and the transistors 10, 11, and 12 of the pixel circuit may be of the p-channel type.

While in the above-described embodiments, the transistors forming the pixel circuit are the MOS transistors, the transistors are not limited thereto as long as they are field effect transistors (FETs).

In the above-described embodiments, the p-type semiconductor substrate includes p-type semiconductor regions such as p-type wells formed in the n-type semiconductor substrate.

In the above-described embodiments, the solid-state imaging device is of the multilayer type using the photoelectric conversion film for the photoelectric converter. However, the structure is not limited thereto. A photo diode may be provided in the semiconductor substrate as the photoelectric converter.

The solid-state imaging device and the method of manufacturing the device according to the present disclosure hardly degrade the image quality even when pixels are miniaturized, and thus useful for digital cameras, etc.

What is claimed is:

1. A solid-state imaging device comprising:
a semiconductor region of a first conductivity type; and
unit pixels, each unit pixel including
a photoelectric converter configured to generate charge;
an impurity region of a second conductivity type forming an accumulation diode together with the semiconductor region, the accumulation diode accumulating the charge from the photoelectric converter;
an amplifier transistor including
a gate electrode electrically connected to the impurity region, and
a source region or a drain region of the second conductivity type in the semiconductor region, and
a channel region in the semiconductor region under the gate electrode, and
a width of the channel region being wider than a width of the source region or a width of the drain region in a width direction of the gate electrode; and
a first isolation region, in the semiconductor region, consisting of an impurity doped region of the first conductivity type and surrounding the amplifier transistor, wherein
entirety of the channel region is the second conductivity type, and
the first conductivity type is different from the second conductivity type.

2. The solid-state imaging device of claim 1, wherein the first isolation region surrounds the impurity region.

3. The solid-state imaging device of claim 1, wherein the photoelectric converter includes
a photoelectric conversion film, above the semiconductor region, configured to photoelectrically convert incident light,
a transparent electrode above the photoelectric conversion film, and
a pixel electrode between the semiconductor region and the photoelectric conversion film, and
the pixel electrode is electrically connected to the impurity region.

4. The solid-state imaging device of claim 1, wherein the channel region is disposed between walls of the first isolation region, and
one of the wall of the first isolation region and one end surface of the gate electrode in a width direction are aligned with each other in a same plane.

5. The solid-state imaging device of claim 1, further comprising a second isolation region containing doped impurities of the first conductivity type, the second isolation region being located in the semiconductor region and electrically isolating adjacent pairs of the unit pixels,
wherein the first isolation region has a higher impurity concentration than the semiconductor region does.

6. The solid-state imaging device of claim 5, wherein the first isolation region has a same impurity concentration as the second isolation region does.

7. The solid-state imaging device of claim 1, wherein
each of the unit pixels further includes a reset transistor configured to reset a potential of the gate electrode of the amplifier transistor,
the channel region of the amplifier transistor contains impurities of the first conductivity type, and
a channel region of the reset transistor contains impurities of the first conductivity type.

8. The solid-state imaging device of claim 1, wherein
each of the unit pixels further includes a reset transistor configured to reset a potential of the gate electrode of the amplifier transistor,
the channel region of the amplifier transistor contains impurities of the second conductivity type, and a channel region of the reset transistor contains impurities of the first conductivity type.

9. The solid-state imaging device according to claim 1, wherein the width of the channel region is greater than a distance of a boundary between the gate electrode and the source or drain region in the gate width direction.

10. The solid-state imaging device of claim 1, wherein no portion of the first isolation is located directly under the gate electrode.

11. The solid-state imaging device of claim 1, wherein the channel region is located entirely under the gate electrode.

12. A solid-state imaging device comprising:
a semiconductor region of a first conductivity type; and
unit pixels, each unit pixel including
a photoelectric converter configured to generate charge,
an impurity region of a second conductivity type forming an accumulation diode together with the semiconductor region, the accumulation diode accumulating the charge from the photoelectric converter,
a reset transistor including
a source or drain region which is the impurity region,
a gate electrode, and
a channel region in the semiconductor region under the gate electrode, and
a first isolation region, in the semiconductor region, consisting of an impurity doped region of the first conductivity type and surrounding the reset transistor, wherein
a width of the channel region is wider than a width of the source region or a width of the drain region in a width direction of the gate electrode,
entirety of the channel region is the second conductivity type, and
the first conductivity type is different from the second conductivity type.

13. The solid-state imaging device of claim 12, wherein the first isolation region surrounds the impurity region.

14. The solid-state imaging device of claim 12, wherein the photoelectric converter includes
a photoelectric conversion film, above the semiconductor region, configured to photoelectrically convert incident light,
a transparent electrode above the photoelectric conversion film, and
a pixel electrode between the semiconductor region and the photoelectric conversion film, and
the pixel electrode is electrically connected to the impurity region.

15. The solid-state imaging device of claim 12, wherein the channel region is disposed between walls of the first isolation region, and
one of the wall of the first isolation region and one end surface of the gate electrode in a width direction are aligned with each other in a same plane.

16. The solid-state imaging device of claim 12, further comprising a second isolation region containing doped impurities of the first conductivity type, the second isolation region being located in the semiconductor region and electrically isolating adjacent pairs of the unit pixels,
wherein the first isolation region has a higher impurity concentration than the semiconductor region does.

17. The solid-state imaging device of claim 16, wherein the first isolation region has a same impurity concentration as the second isolation region does.

18. The solid-state imaging device according to claim 12, wherein the width of the channel region is greater than a distance of a boundary between the gate electrode and the source or drain region in the gate width direction.

19. The solid-state imaging device of claim 12, wherein no portion of the first isolation is located directly under the gate electrode.

20. The solid-state imaging device of claim 12, wherein the channel region is located entirely under the gate electrode.

* * * * *